United States Patent
Hagihara

(10) Patent No.: US 8,154,638 B2
(45) Date of Patent: Apr. 10, 2012

(54) SOLID-STATE IMAGE PICKUP APPARATUS

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 330 days.

(21) Appl. No.: 12/484,502

(22) Filed: Jun. 15, 2009

(65) Prior Publication Data

US 2009/0310002 A1 Dec. 17, 2009

(30) Foreign Application Priority Data

Jun. 16, 2008 (JP) ................ P2008-156484

(51) Int. Cl.
*H04N 3/14* (2006.01)

(52) U.S. Cl. ..................................... 348/302
(58) Field of Classification Search .................... 348/302
See application file for complete search history.

(56) References Cited

U.S. PATENT DOCUMENTS

| | | | | |
|---|---|---|---|---|
| 5,404,172 A | * | 4/1995 | Berman et al. | 348/465 |
| 5,608,425 A | * | 3/1997 | Movshovich | 345/467 |
| 5,777,520 A | * | 7/1998 | Kawakami | 331/1 R |
| 6,791,610 B1 | * | 9/2004 | Butler et al. | 348/297 |
| 7,208,934 B2 | * | 4/2007 | King et al. | 324/76.39 |
| 2006/0077297 A1 | * | 4/2006 | Sonobe | 348/536 |
| 2006/0214086 A1 | * | 9/2006 | Fukushima | 250/208.1 |
| 2006/0243885 A1 | * | 11/2006 | Watanabe | 250/208.1 |
| 2007/0153129 A1 | * | 7/2007 | Kawamoto et al. | 348/705 |
| 2009/0109308 A1 | * | 4/2009 | Fukushima | 348/294 |

FOREIGN PATENT DOCUMENTS

JP 2006270293 A 10/2006

* cited by examiner

*Primary Examiner* — Lin Ye
*Assistant Examiner* — Amy Hsu
(74) *Attorney, Agent, or Firm* — Westerman, Hattori, Daniels & Adrian, LLP

(57) ABSTRACT

A frequency converting unit 101 includes a connection circuit for connecting a plurality of inverting circuits through which a delay time between an input signal and an output signal is changed according to a magnitude of the signal output by the image pickup unit, and one or a plurality of switch elements which are connected between an output terminal of the inverting circuit and an input terminal of another inverting circuit not adjacent to the inverting circuit, and generates a clock signal having a frequency according to the connection circuit. The control unit 20 controls the switch elements included in the frequency converting unit 101 to open and close. The count unit 103 counts the clock signal generated by the frequency converting unit.

5 Claims, 8 Drawing Sheets

FIG. 10

|  |  | NUMBER OF INVERTING CIRCUITS | | | | | |
|---|---|---|---|---|---|---|---|
|  |  | 7 STAGES | | 15 STAGES | | 31 STAGES | |
|  |  | DELAY TIME [nsec] | FREQUENCY [MHz] | DELAY TIME [nsec] | FREQUENCY [MHz] | DELAY TIME [nsec] | FREQUENCY [MHz] |
| DELAY TIME (/1 STAGE) | 0.1 [nsec] | 0.7 | 1428.6 | 1.5 | 666.7 | 3.1 | 322.6 |
|  | 0.5 [nsec] | 3.5 | 285.7 | 7.5 | 133.3 | 15.5 | 64.5 |
|  | 1 [nsec] | 7 | 142.9 | 15 | 66.7 | 31 | 32.3 |
|  | 5 [nsec] | 35 | 28.6 | 75 | 13.3 | 155 | 6.5 |
|  | 10 [nsec] | 70 | 14.3 | 150 | 6.7 | 310 | 3.2 |

FIG. 11

|  |  | NUMBER OF INVERTING CIRCUITS | | | | | |
|---|---|---|---|---|---|---|---|
|  |  | 8 STAGES | | 16 STAGES | | 32 STAGES | |
|  |  | DELAY TIME [nsec] | FREQUENCY [MHz] | DELAY TIME [nsec] | FREQUENCY [MHz] | DELAY TIME [nsec] | FREQUENCY [MHz] |
| DELAY TIME (/1 STAGE) | 0.1 [nsec] | 0.8 | 1250 | 1.6 | 625 | 3.2 | 312.5 |
|  | 0.5 [nsec] | 4.0 | 250 | 8 | 125 | 16 | 62.5 |
|  | 1 [nsec] | 8 | 125 | 16 | 62.5 | 32 | 31.25 |
|  | 5 [nsec] | 40 | 25 | 80 | 12.5 | 160 | 6.25 |
|  | 10 [nsec] | 80 | 12.5 | 160 | 6.25 | 320 | 3.125 |

SOLID-STATE IMAGE PICKUP APPARATUS

BACKGROUND OF THE INVENTION

1. Field of the Invention

The present invention relates to a solid-state image pickup apparatus such as a digital camera. Priority is claimed on Japanese Patent Application No. 2008-156484, filed Jun. 16, 2008, the content of which is incorporated herein by reference.

2. Description of Related Art

In the past, solid-state image pickup apparatuses are proposed using various image pickup devices such as a MOS image pickup device and a CCD image pickup device, and have been put to practical use. In addition, as an example of the solid-state image pickup apparatus provided with the MOS image pickup device, there is an amplification type solid-state image pickup apparatus which is configured such that an amplification type solid-state image pickup device (for example, an Active Pixel Sensor (APS)) having driving transistors for amplification is provided in a pixel signal generating apparatus generating pixel signals according to signal charges generated by a charge generating apparatus. Most (C)MOS solid-state image pickup apparatuses are configured as describe above.

In addition, a column ADC type solid-state image pickup apparatus which is configured to build an A/D conversion (analog-digital conversion) function in a column unit is also developed and commercialized. As a scheme of the A/D conversion, a successive-approximation A/D converting scheme, a single slope A/D converting scheme, and a cyclic A/D converting scheme are known. Further, the column ADC (A/D Converter) type solid-state apparatus which is configured to build a Time to Digital Converter (TDC, a time-digital converter) having a function of "voltage-frequency conversion" according to a signal from a pixel in the column unit is known (for example, refer to JP-A-2006-270293). JP-A-2006-270293 discloses that a signal from the pixel can be easily converted from analogue to digital with a high S/N ratio using a TDC.

SUMMARY OF THE INVENTION

When the TDC is applied to the column ADC type solid-state image pickup apparatus, there is a problem regarding resolution.

Since an offset component (a pseudo signal component overlapping with signal components) in the A/D conversion using the TDC is great, an actual resolution obtained by deducting the offset component from resulting signals in the A/D conversion increases. For this reason, in order to increase the actual resolution in the column ADC type solid-state image pickup apparatus described in JP-A-2006-270293, there is a need for increasing the operation speed of an inverting circuit constituting the TDC. In order to increase the operation speed of the inverting circuit, it is necessary to amplify the signal output from the pixel by using an amplifier or the like. However, if the amplifier is built in, the circuitry becomes complete, the scale of the circuitry increased, and power consumption increases.

The invention has been made in order to solve the above-mentioned problem, and an object is to provide a solid-state image pickup apparatus in which a function of amplifying the signal output from the pixel can be easily implemented by using a simple circuit configuration.

According to an aspect of the invention, there is provided a solid-state image pickup apparatus including: an image pickup unit which includes a photoelectric conversion element and a plurality of pixels generating and outputting signals according to a magnitude of an incident electromagnetic wave; a frequency converting unit which includes a connection circuit for connecting a plurality of inverting circuits in a ring shape through which a delay time between an input signal and an output signal is changed according to the magnitude of the signal output by the image pickup unit, and one or a plurality of switch elements which are connected between an output terminal of the inverting circuit and an input terminal of another inverting circuit not adjacent to the inverting circuit, the frequency converting unit generating a clock signal having a frequency according to the connection circuit; a control unit which controls the switch elements included in the frequency converting unit to open and close; and a count unit which counts the clock signal generated by the frequency converting unit.

With such a configuration, the circuit configuration generating a clock signal can be easily changed by controlling the switch elements. Therefore, according to the invention, the function of amplifying the signal output from the image pickup unit can be realized by using a simple circuit configuration without an amplifying apparatus built therein. In addition, according to the invention, since the signal output from the image pickup unit can be amplified, it is possible to obtain an image with high resolution and a high S/N (Signal to Noise Ratio).

In the solid-state image pickup apparatus according to the invention, the control unit controls the switch elements to open and close according to the magnitude of the signal output by the image pickup unit.

With such a configuration, the circuit configuration generating the clock signal can be dynamically changed by controlling the switch elements with the control unit according to a magnitude of the signal output from the image pickup unit.

In the solid-state image pickup apparatus according to the invention, the count unit is configured of an asynchronous counter.

With such a configuration, even when a pulse signal output by the frequency converting unit is output at a high speed, a count process can be easily performed.

In the solid-state image pickup apparatus according to the invention, the count unit includes an up-count mode and a down-count mode.

With such a configuration, the count unit can perform a counting process according to the type of signal output by the image pickup unit. The count unit counts in the up-count mode when the type of signal output by the image pickup unit corresponds to a reset level, and counts in the down-count mode when the type of signal output by the image pickup unit corresponds to a signal level, for example. Therefore, when performing digital signal processing, the count unit can easily perform a correlated double sampling (CDS) process.

In the solid-state image pickup apparatus according to the invention, the frequency converting unit is configured of a voltage controlled oscillator or a ring delay line.

With such a configuration, the frequency converting unit according to the invention can be realized by using a simple circuit configuration.

According to the invention, the function of amplifying the signal output by the pixel can be realized by using the simple circuit configuration.

BRIEF DESCRIPTION OF THE DRAWINGS

FIG. 10 is a view illustrating a frequency variable range in case of using a VCO configured of an odd number of delay elements as a frequency converting unit.

FIG. 11 is a view illustrating a frequency variable range in case of using an RDL configured of an even number of delay elements as a frequency converting unit.

DETAILED DESCRIPTION OF THE INVENTION

Figure 1:
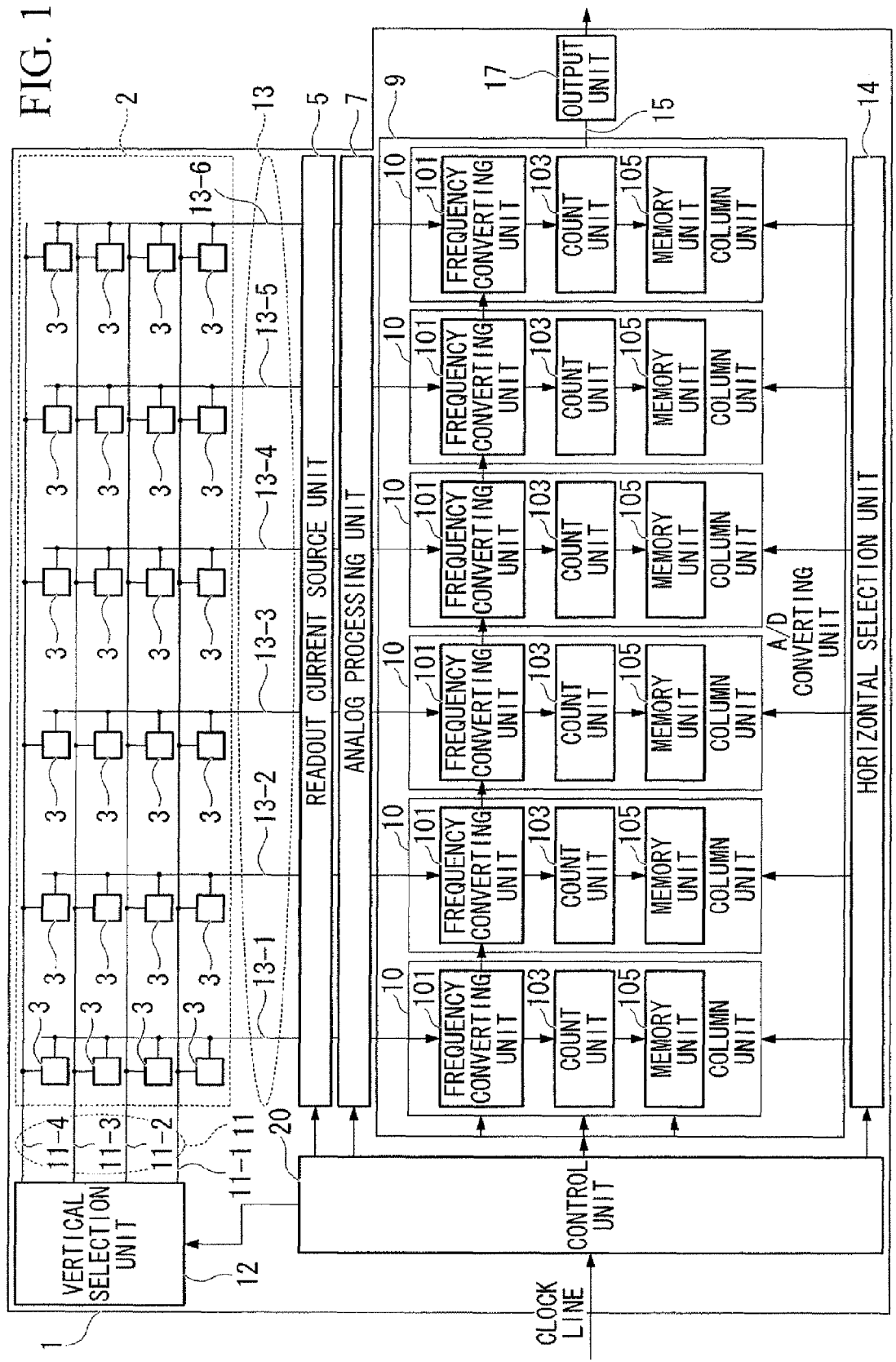
FIG. 1 is a view illustrating a configuration of a (C)MOS solid-state image pickup apparatus according to the invention.

In the following, embodiments of the invention will be described with reference to the accompanying drawings. FIG. 1 is a view illustrating a configuration of a (C)MOS solid-state image pickup apparatus according to a first embodiment. In the illustrated example, the solid-state image pickup apparatus 1 generates signals according to a magnitude of an incident electromagnetic wave, and is provided with an image pickup unit 2 in which plural unit pixels 3 outputting the generated signals and disposed in a matrix shape. The solid-state image pickup apparatus 1 is provided with a vertical selection unit 12 for selecting the respective rows of the unit pixels 3 included in the image pickup unit 2. The solid-state image pickup apparatus 1 is provide with a readout current source unit 5 for reading out the signals output from the image pickup unit 2 as voltage signals. The solid-state image pickup apparatus 1 is provided with an analog processing unit 7 for performing a correlated double sampling (CDS) process and a clamp process on the voltage signal read by the readout current source unit 5. The solid-state image pickup apparatus 1 is provided with an A/D converting unit 9 having column units 10 for performing the A/D conversion according to the voltage signal processed by the analog processing unit 7. The solid-state image pickup apparatus 1 is provided with a horizontal selection unit 14 for selecting data stored within the column unit 10. The solid-state image pickup apparatus 1 is provided with an output unit 17 for outputting data selected by the horizontal selection unit 14. In addition, the solid-state image pickup apparatus 1 is provided with a control unit 20 for performing control on each unit of the solid-state image pickup apparatus 1.

The image pickup unit 2 shown in FIG. 1 is configured of "4×6" unit pixels 3 for simple description, but in practice, several tens to thousands of the unit pixels 3 are provided on each row and each column of the image pickup unit 2. In addition, the unit pixels 3 constituting the image pickup unit 2 are configured of photoelectric conversion elements such as a photo diode, a photo gate, and a photo transistor, and transistor circuits, but all of which are omitted in the drawing.

The unit pixels 3 are connected to the vertical selection unit 12 via vertical control lines 11 (11-1 to 11-4) for selecting rows. In addition, the signals output from the unit pixels 3 are transmitted to the readout current source unit 5 and the analog processing unit 7 via vertical signal lines 13 (13-1 to 13-6) connected therebetween, respectively.

Figure 2:
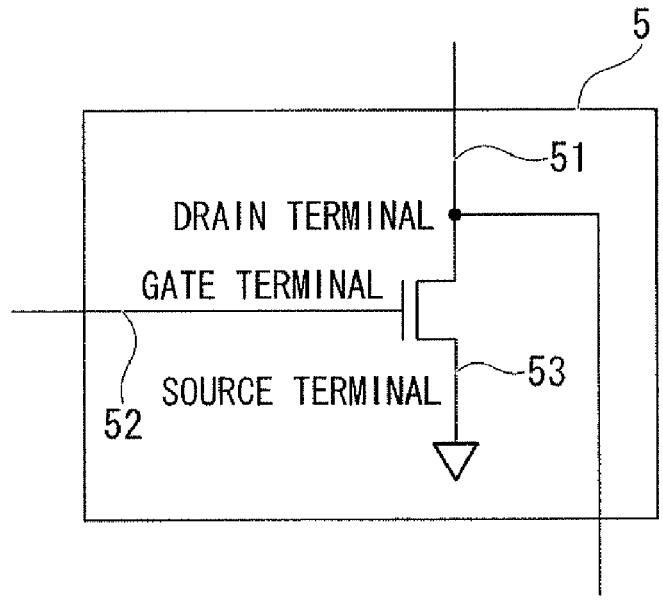
FIG. 2 is a view illustrating a circuit of a readout current source unit.

FIG. 2 is a view illustrating an example of a circuit of the readout current source unit 5 according to this embodiment. In the illustrated example, the readout current source unit 5 is configured of an NMOS transistor. The vertical signal line 13 from the image pickup unit 2 is connected to a drain terminal 51, a desired voltage is applied to a control terminal 52 (gate terminal), and a source terminal 53 is connected to a GND (ground). With such a configuration, a signal from the pixel is output in a voltage mode. In the illustrated example, while the readout current source unit 5 is described only to be configured of the NMOS transistor, but the invention is not necessarily limited thereto.

Figure 3:
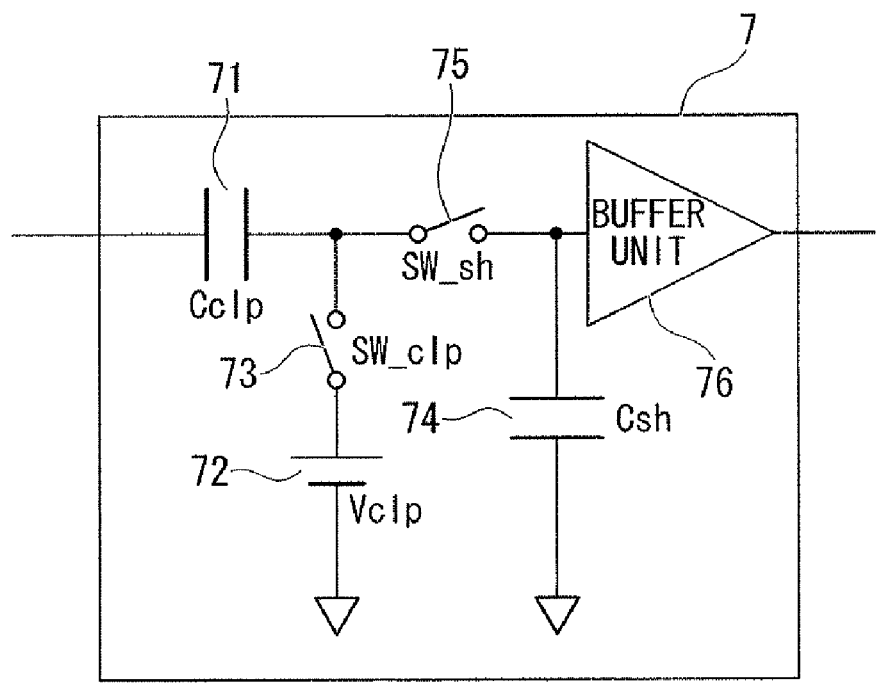
FIG. 3 is a view illustrating a circuit of an analog processing unit.

FIG. 3 is a view illustrating an example of a circuit of the analog processing unit 7 according to this embodiment. In the illustrated example, the function of the CDS process is provided as noise removal means. The analog processing unit 7 is provided with a clamp capacitor 71 (Cclp) connected to the vertical signal line 13, a clamp switch 73 (SW_clp) for clamping the clamp capacitor 71 to a clamp bias 72 (Vclp), a sample-and-hold capacitor 74 (Csh) for sampling and holding a signal, a sample-and-hold switch 75 (SW_sh), and a buffer unit 76.

When the CDS process is performed, with respect to a pixel signal which is in the voltage mode and input via the vertical signal line 13, the analog processing unit 7 performs a differential process between a signal level (reset level) immediately after the pixel is reset and an actual signal level on the basis of two pulses of a clamp pulse (CLP) given by the control unit 20 and a sample pulse (SH). By this, noise components referred to as a fixed pattern noise (FPN) or a reset noise which generate a fixed variation in every pixel are removed. In addition, the analog processing unit 7 may also be provided with an auto gain control (AGC) circuit having a function of amplifying a signal and other processing functions as needed, other than the function of the CDS process.

The vertical selection unit 12 and the horizontal selection unit 14 implement selection operations in response to driving pulses given by the control unit 20. In addition, various pulse signals for driving the unit pixels 3 are transmitted through the respective vertical control lines 11-1 to 11-4. Further, the vertical selection unit 12 is configured of vertical shift registers or decoders which perform basic control to read signals, but all of which are omitted in the drawing. The vertical selection unit 12 may also be configured of shift registers or decoders which perform row control for an electronic shutter. Similarly, the horizontal selection unit 14 also includes horizontal shift registers or decoders, and has a function of selection means to select data, which is stored in the column circuits 10 constituting the A/D converting unit 9, in a predetermined order and to output the selected pixel information to a horizontal signal line 15.

The control unit 20 performs control on a frequency converting unit 101. The specific control method will be described later. The control unit 20 is provided with a function block of a timing generator (TG) supplying clocks necessary to operate each unit or pulse signals at a predetermined timing, and a function block for performing communication with the TG The control unit 20 may be configured as a separate semiconductor integrated circuit which is provided independently from other function elements such as the image pickup unit 2, the vertical selection unit 12 and the horizontal selection unit 14. In this case, the image pickup apparatus as an example of the semiconductor system is established by the image pickup device including the image pickup unit 2, the vertical selection unit 12, the horizontal selection unit 14 and the like, and the control unit 20. The image pickup apparatus may be configured as an image pickup module into which peripheral signal processing, power circuits and the like are assembled.

The column unit 10 is provided with the frequency converting unit 101, a count unit 103, and a memory unit 105. The frequency converting unit 101 performs frequency conversions according to a signal from the image pickup unit 2 via the analog processing unit 7. The configuration of the frequency converting unit 101 will be described later. The count unit 103 performs a count process on the count pulses output by the frequency converting unit 101. The memory unit 105 holds a value counted by the count unit 103.

The count unit 103 is preferably configured of an asynchronous counter circuit which is easy to control, but it may be configured of a synchronous counter circuit. In addition, a pixel signal output from the image pickup unit 2 is represented by a reference level such as a reset level and an actual signal level overlapped with the reset level. Therefore, in order to extract the actual signal level, it is necessary to perform the differential process between the reset level and the signal level.

The differential process can be easily performed by using an up-down counter which serves as a counter circuit constituting the count unit 103 and includes the up-count mode and the down-count mode. For example, the differential process may be performed by setting the up-down counter to the up-count mode at the time of reading out the reset level, or to the down-count mode at the time of reading out the signal level.

In addition, the differential process may be performed by setting the up-down counter to the down-count mode at the time of reading out the reset level, or to the up-count mode at the time of reading out the signal level. Since the differential process is not necessary to be implemented by the count unit 103, there is no need to limit the counter circuit constituting the count unit 103 to the up-down counter.

The output unit 17 amplifies the pixel signal which is output from each unit pixel 3 of the image pickup unit 2 via the horizontal signal line 15 to have a proper gain, and thereafter outputs the amplified pixel signal as an image pickup signal to an external circuit. For example, the output unit 17 may have a signal processing function only performing a buffering, or other functions performing processes such as black level adjustment, column variation correction, color processing, or the like before performing the buffering. In addition, the output unit 17 may convert n-bit parallel digital data into serial data to be output. In this case, for example, a multiplication circuit such as a phase locked loop (PLL) may be built in the solid-state image pickup apparatus 1.

Next, the frequency converting unit 101 used in the solid-state image pickup apparatus according to this embodiment will be described now. First, an example of the frequency converting unit 101 including a voltage controlled oscillator (VCO) will be described. In this case, the VCO is configured by connecting an odd number of inverting circuits in a ring shape, and each inverting circuit changes a delay quantity according to a magnitude of a signal. The frequency converting unit 101 controls a frequency of a signal circulating in the VCO by controlling the delay quantity of the inverting circuit according to a voltage input to the inverting circuit.

Figure 4:
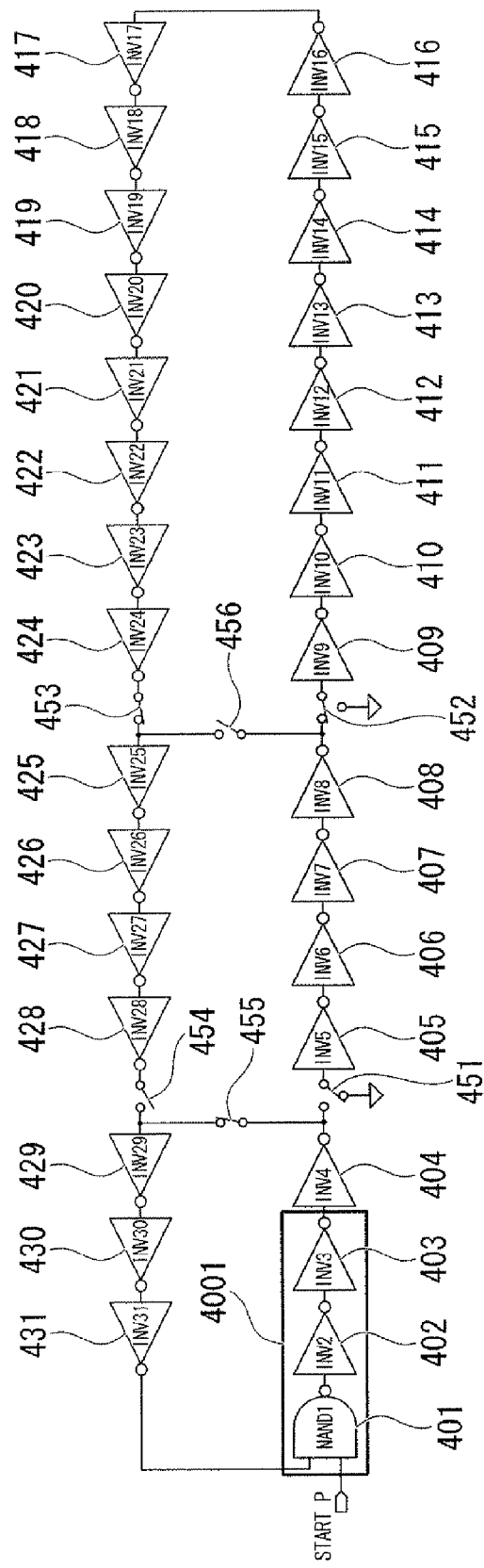
FIG. 4 is a view illustrating a circuit of a frequency converting unit.

FIG. 4 is a view illustrating an example of a circuit of the frequency converting unit 101 according to this embodiment.

In the illustrated example, the frequency converting unit 101 is configured of "31" circuits of one NAND (negative logical product) circuit 401 serving as the inverting circuit which is used for activation and operated by receiving a pulse signal (control signal) StartP to one input terminal thereof, and inverter (INV) circuits 402 to 431 serving as the inverting circuit, and all of which are connected to each other in series. In this circuit, the inverting operation is started when the pulse signal StartP is changed from a Low state to a High state and the inverting operation is performed during the pulse signal StartP is in the High state. In addition, the total number of the inverter circuits and the NAND circuits which constitute the VCO is not limited to "31", and there is no limitation in the total number as long as the total number is an odd number in "3" or more.

Figure 5:
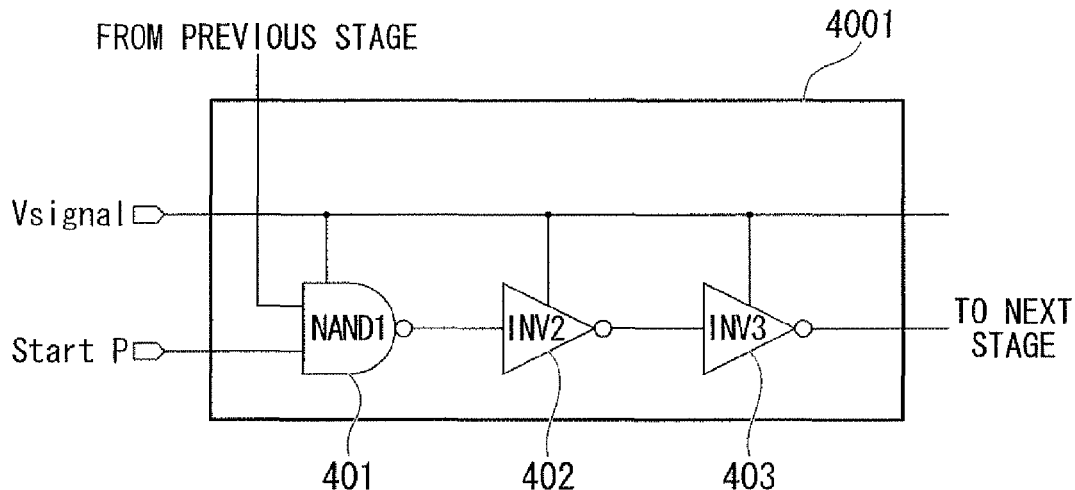
FIG. 5 is an enlarged view illustrating a part of a circuit of a frequency converting unit.
Figure 6:
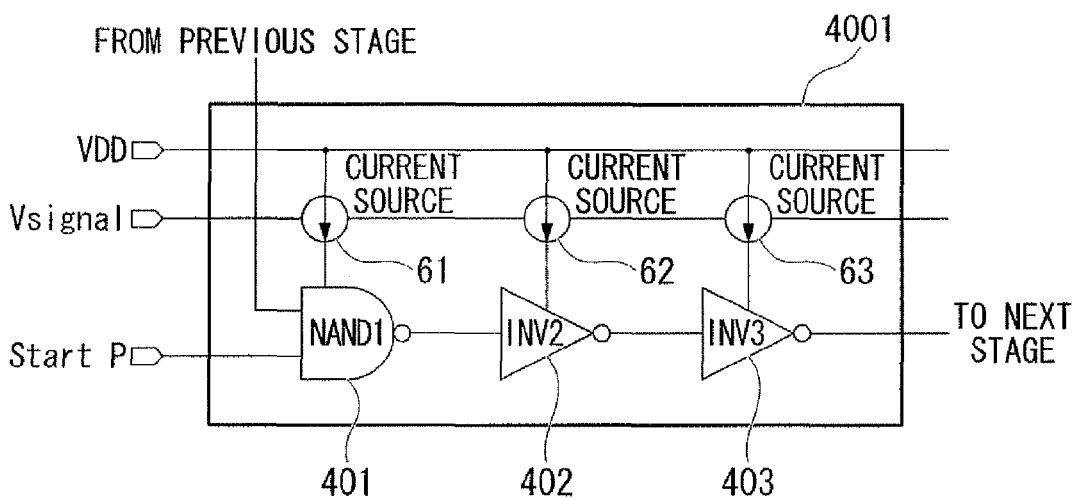
FIG. 6 is an enlarged view illustrating a part of a circuit of a frequency converting unit.

FIGS. 5 and 6 are enlarged views illustrating a part (corresponding to a part indicated with reference number 4001 in FIG. 4) of a circuit of the frequency converting unit 101 according to this embodiment. The entire configuration of the circuit of the frequency converting unit 101 according to this embodiment may be configured as those shown in FIGS. 5 and 6. FIG. 5 is an example of a configuration in which a signal voltage (Vsignal) is input to a power source (upper potential) terminal of the inverting circuit. With such a configuration, a propagation delay time of the inverting circuit can be controlled by a magnitude of the signal voltage (Vsignal). In addition, the signal voltage (Vsignal) may be input to a GND (lower potential) terminal of the inverting circuit.

FIG. 6 is an example of a configuration in which current sources 61 to 63 having a current value according to the signal voltage (Vsignal) are connected to a power source VDD (upper potential) terminal of the inverting circuit. With such a configuration, the propagation delay time of the inverting circuit can be controlled. In addition, the current sources 61 to 63 may be connected to the GND (lower potential) terminal of the inverting circuit, or to both terminals of the power sources VDD and GND.

Hereinafter, the explanation will be returned to FIG. 4. The frequency converting unit 101 according to this embodiment is provided with switch elements 451 to 456 in order to change the number of the inverting circuits (which constitute the VCO) for actually processing the pulse signal StartP among the inverting circuits constituting the frequency converting unit 101.

In the illustrated example, the frequency converting unit 101 is provided with the switch element 451 between the output terminal of the inverter circuit 404 and the input terminal of the inverter circuit 405. The frequency converting unit 101 is provided with a switch element 452 between the output terminal of the inverter circuit 408 and the input terminal of the inverter circuit 409. The frequency converting unit 101 is provided with a switch element 453 between the output terminal of the inverter circuit 424 and the input terminal of the inverter circuit 425. In addition, the frequency converting unit 101 is provided with a switch element 454 between the output terminal of the inverter circuit 428 and the input terminal of the inverter circuit 429.

In addition, the frequency converting unit 101 is provided with the switch element 455 such that the output terminal of the inverter circuit 404 is connected with the input terminal of the inverter circuit 429. The frequency converting unit 101 is provided with a switch element 456 such that the output terminal of the inverter circuit 408 is connected with the input terminal of the inverter circuit 425.

In the illustrated example, when a switch element 451 is in an OFF (open) state, the input terminal of the inverter circuit 405 is connected to the ground (GND). In addition, when the switch element 452 is in an OFF state, the input terminal of the inverter circuit 409 is connected to the ground.

By providing the switch elements 451 to 456 and causing the control unit 20 to control these switch elements to open and close, the number of the inverting circuits constituting the VCO included in the frequency converting unit 101 can be changed. The switch elements 455 and 456 are connected between the output terminal of one inverter circuit and the input terminal of another inverter circuit not adjacent to the one inverter circuit, and the number of the inverting circuits actually processing the pulse signal StartP is changed by opening and closing the switch elements 455 and 456. In addition, the switch elements 451, 452, 453, and 454 separate unnecessary inverter circuits from the VCO actually processing the pulse signal StartP, and stabilize the operation of the VCO.

Specifically, the control unit 20 controls the switch element 451 to be in the OFF (open) state, the switch element 452 to be in the ON (close) state, the switch element 453 to be in the ON state, the switch element 454 to be in the OFF state, the switch element 455 to be in the ON state, and the switch element 456 to be the OFF state, and thus the VCO is configured of "7" inverting circuits which consist of the NAND circuit 401 and the inverter circuits 402 to 404 and 429 to 431.

In addition, the control unit 20 controls the switch element 451 to be in the ON state, the switch element 452 to be in the OFF state, the switch element 453 to be in the OFF state, the switch element 454 to be in the ON state, the switch element 455 to be in the OFF state, and the switch element 456 to be in the ON state, and thus the VCO is configured of "15" inverting circuits which consist of the NAND circuit 401 and the inverter circuits 402 to 408 and 425 to 431.

In addition, the control unit 20 controls the switch element 451 to be in the ON state, the switch element 452 to be in the ON state, the switch element 453 to be in the ON state, the switch element 454 to be in the ON state, the switch element 455 to be in the OFF state, and the switch element 456 to be in the OFF state, and thus the VCO is configured of "31" inverting circuits which consist of the NAND circuit 401 and the inverter circuits 402 to 431.

As described above, by causing the control unit 20 to control the switch elements 451 to 456 included in the frequency converting unit 101, the number of the inverting circuits constituting the VCO can be changed. In addition, the number and arrangement of the switch elements are not limited to the configuration shown in FIG. 4, and there is no limitation in the number and arrangement of the inverting circuits constituting the VCO as long as these can be changed.

In addition, the switch elements 451 to 456 may be analog-digital switch elements using, for example, CMOS transistors. The switch elements 451 to 456 are not particularly limited as long as these have a function of switching.

Next, an example of the frequency converting unit 101 including a RDL (Ring Delay Line) will be described now. In this case, the RDL is configured by connecting an even number of inverting circuits in a ring shape, and each inverting circuit changes the delay quantity according to a magnitude of a signal. In addition, the frequency converting unit 101 controls the delay quantity of the inverting circuit according to a voltage input to the inverting circuit. Therefore, the frequency of a signal circulating the RDL is controlled.

Figure 7:
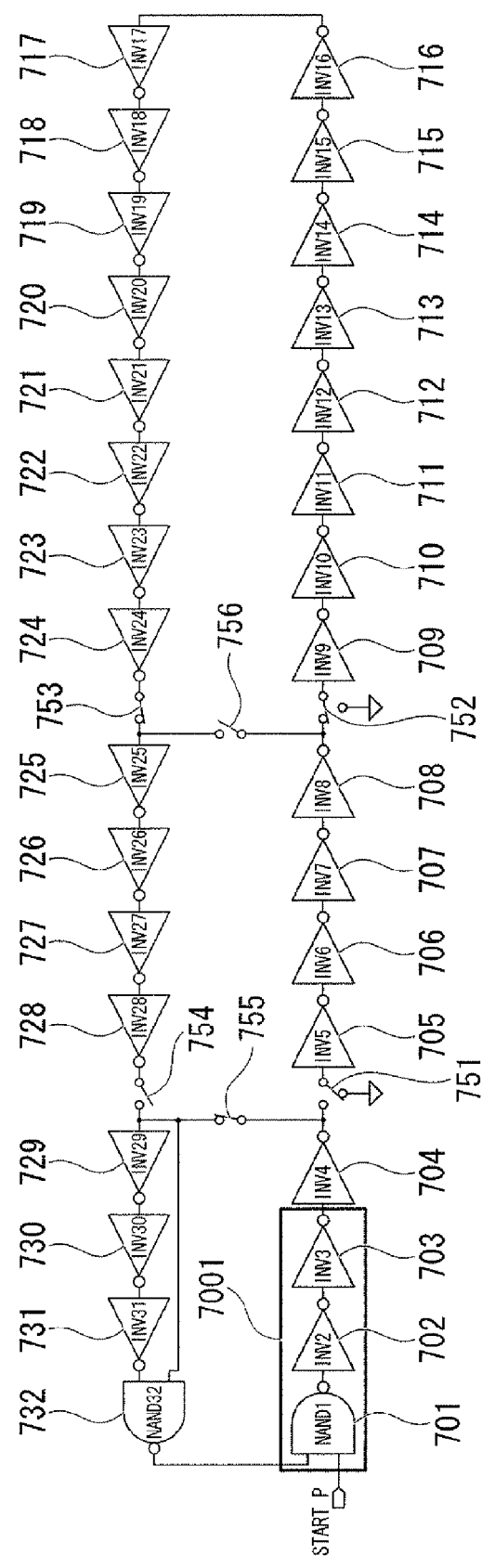
FIG. 7 is a view illustrating a circuit of a frequency converting unit.

FIG. 7 is a view illustrating an example of a circuit of the frequency converting unit 101 according to this embodiment.

In the illustrated example, the frequency converting unit 101 is configured of "32" circuits of one NAND circuit 701 serving as the inverting circuit which is used for activation and operated by receiving a pulse signal (control signal) StartP to one input terminal thereof and receiving an output of the NAND circuit in the previous stage to the other input terminal, inverter (INV) circuits 702 to 731 serving as the inverting circuit, and one NAND circuit 732 configured to receive the same signal to one input terminal as the signal which is input to the inverter circuit 729 serving as a feedforward loop, and all of which are connected to each other in series. In addition, the feedforward loop is provided to oscillate the output of each delay element in a cycle according to a delayed time of each delay element (the NAND circuits 701 and 732 and the inverters 702 to 731) while the pulse signal StartP is being input.

In this circuit, the inverting operation is started when the pulse signal StartP is changed from a Low state to a High state and the inverting operation is performed while the pulse signal StartP is in the High state. In addition, the total number of the inverter circuits and NAND circuits which constitute the RDL is not limited to "32", and there is no limitation to the total number as long as the total number is an even number of "4" or more. In addition, the configuration of the feedforward loop is not limited to the above-mentioned configuration.

Figure 8:
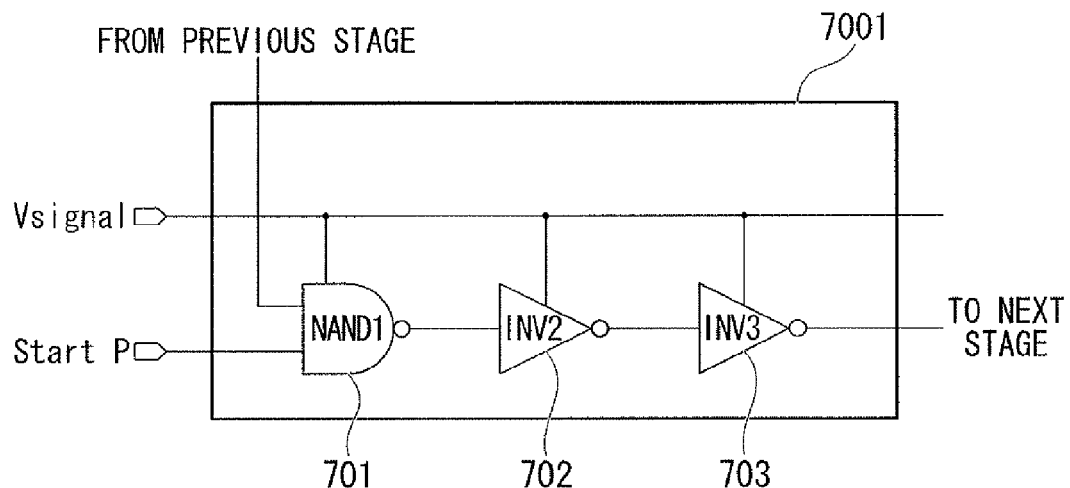
FIG. 8 is an enlarged view illustrating a part of a circuit of a frequency converting unit.
Figure 9:
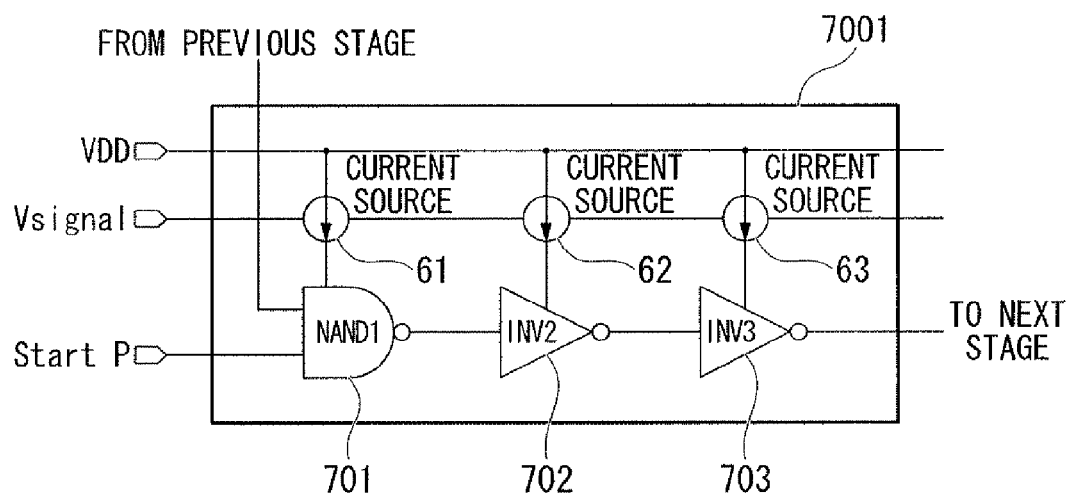
FIG. 9 is an enlarged view illustrating a part of a circuit of a frequency converting unit.

FIGS. 8 and 9 are enlarged views illustrating a part (corresponding to a part indicated with reference number 7001 in FIG. 7) of a circuit of the frequency converting unit 101 according to this embodiment. The entire configuration of the circuit of the frequency converting unit 101 according to this embodiment may be configured as those shown in FIGS. 8 and 9. The exemplary configuration shown in FIG. 8 is similar to that shown in FIG. 5. In addition, the exemplary configuration shown in FIG. 9 is similar to that shown in FIG. 6.

Hereinafter, the explanation will return to FIG. 7. The frequency converting unit 101 according to this embodiment is provided with switch elements 751 to 756 in order to change the number of the inverting circuits (which constitute the RDL) for actually processing the pulse signal StartP among the inverting circuits constituting the frequency converting unit 101.

In the illustrated example, the frequency converting unit 101 is provided with the switch element 751 between the output terminal of the inverter circuit 704 and the input terminal of the inverter circuit 705. The frequency converting unit 101 is provided with the switch element 752 between the output terminal of the inverter circuit 708 and the input terminal of the inverter circuit 709. The frequency converting unit 101 is provided with the switch element 753 between the output terminal of the inverter circuit 724 and the input terminal of the inverter circuit 725. In addition, the frequency converting unit 101 is provided with the switch element 754 between the output terminal of the inverter circuit 728 and the input terminal of the inverter circuit 729.

In addition, the frequency converting unit 101 is provided with the switch element 755 such that the output terminal of the inverter circuit 704 is connected with the input terminal of the inverter circuit 729 and the input terminal of the NAND circuit 732. The frequency converting unit 101 is provided with the switch element 756 such that the output terminal of the inverter circuit 708 is connected with the input terminal of the inverter circuit 725.

In the illustrated example, when the switch element 751 is in the OFF state, the input terminal of the inverter circuit 705 is connected to the ground. In addition, when the switch element 752 is in the OFF state, the input terminal of the inverter circuit 709 is connected to the ground.

By providing the switch elements 751 to 756 in the frequency converting unit 101 and causing the control unit 20 to control these switch elements to open and close, the number of the inverting circuits constituting the RDL included in the frequency converting unit 101 can be changed. Specifically, the control unit 20 controls the switch element 751 to be in the OFF state, the switch element 752 to be in the ON state, the switch element 753 to be in the ON state, the switch element 754 to be in the OFF state, the switch element 755 to be in the ON state, and the switch element 756 to be in the OFF state, and thus the RDL is configured of "8" inverting circuits which consist of the NAND circuits 701 and 732 and the inverter circuits 702 to 704 and 729 to 731.

In addition, the control unit 20 controls the switch element 751 to be in the ON state, the switch element 752 to be in the OFF state, the switch element 753 to be in the OFF state, the switch element 754 to be in the ON state, the switch element 755 to be in the OFF state, and the switch element 756 to be in the ON state, and thus the RDL is configured of "16" inverting circuits which consist of the NAND circuits 701 and 732 and the inverter circuits 702 to 708 and 725 to 731.

In addition, the control unit 20 controls the switch element 751 to be in the ON state, the switch element 752 to be in the ON state, the switch element 753 to be in the ON state, the switch element 754 to be in the ON state, the switch element 755 to be in the OFF state, and the switch element 756 to be in the OFF state, and thus the RDL is configured of "32" inverting circuits which consist of the NAND circuits 701 and 732 and the inverter circuits 702 to 731.

As described above, by causing the control unit 20 to control the switch elements 751 to 756 included in the frequency converting unit 101, the number of the inverting circuits constituting the RDL can be changed. In addition, the number and arrangement of the switch elements are not limited to the configuration shown in FIG. 7, and there is no limitation in the number and arrangement of the inverting circuits constituting the RDL as long as these can be changed.

In addition, the switch elements 751 to 756 may be the analog-digital switch elements using, for example, CMOS transistors. The switch elements 751 to 756 are not particularly limited as long as these have a function of switching.

Next, a frequency variable (frequency modulation) range in the frequency converting unit 101 will be described.

FIG. 10 is a view illustrating the frequency variable range in case of using the VCO configured of an odd number of the delay elements as the frequency converting unit. In this drawing, delay times for every stage of the inverting circuit, delay times according to the number of the inverting circuits constituting the VCO, and frequencies corresponding thereto are shown. The drawing shows the cases where the delay times for every stage of the inverting circuit are 0.1 nsec, 0.5 nsec, 1 nsec, 5 nsec, and 10 nsec.

The first row in the drawing shows the case where the delay time for every stage of the inverting circuit is 0.1 nsec. In this case, when the number of the inverting circuits constituting the VCO corresponds to "7" stages, the delay time for every circulation of the VCO circuit is 0.7 nsec, and the frequency thereof is 1428.6 MHz. When the number of the inverting circuits constituting the VCO corresponds to "15" stages, the delay time for every circulation of the VCO circuit is 1.5 nsec, and the frequency thereof is 666.7 MHz. In addition, when the number of the inverting circuits constituting the VCO corresponds to "31" stages, the delay time for every circulation of the VCO circuit is 3.1 nsec, and the frequency thereof is 322.6 MHz.

The cases where the delay times for every stage of the inverting circuit are 0.5 nsec, 1 nsec, 5 nsec, and 10 nsec are the same as described in the drawing.

As described above, when the VCO is configured of "7" stages of the inverting circuit, the frequency variable range is 14.3 MHz to 1428.6 MHz. When the VCO is configured of "15" stages of the inverting circuit, the frequency variable range is 6.7 MHz to 666.7 MHz. Further, when the VCO is configured of "31" stages of the inverting circuit, the frequency variable range is 3.2 MHz to 322.6 MHz. Therefore, the frequency converting unit 101 according to this embodiment has the frequency variable range increased to 4 times that of the known frequency converting circuit (the frequency converting circuit in which the VCO is configured of "31" stages of the inverting circuit).

FIG. 11 is a view illustrating the frequency variable range in case of using the RDL configured of an even number of the delay elements as the frequency converting unit. In this drawing, delay times for every stage of the inverting circuit, delay times according to the number of the inverting circuits constituting the RDL, and the frequencies are shown. The drawing shows the cases where the delay times for every stage of the inverting circuit are 0.1 nsec, 0.5 nsec, 1 nsec, 5 nsec, and 10 nsec.

The first row in the drawing shows the case where the delay time for every stage of the inverting circuit is 0.1 nsec. In this case, when the number of the inverting circuits constituting the RDL corresponds to "8" stages, the delay time for every circulation of the RDL circuit is 0.8 nsec, and the frequency thereof is 1250 MHz. Further, when the number of the inverting circuits constituting the RDL corresponds to "16" stages, the delay time for every circulation of the RDL circuit is 1.6 nsec, and the frequency thereof is 625 MHz. Further, when the number of the inverting circuits constituting the RDL corresponds to "32" stages, the delay time for every circulation of the RDL circuit is 3.2 nsec, and the frequency thereof is 312.5 MHz.

The cases where the delay time for every stage of the inverting circuit are 0.5 nsec, 1 nsec, 5 nsec, and 10 nsec are the same as described in the drawing.

As described above, when the RDL is configured of "8" stages of the inverting circuit, the frequency variable range is 12.5 MHz to 1250 MHz. When the RDL is configured of "16" stages of the inverting circuit, the frequency variable range is 6.25 MHz to 625 MHz. Further, when the RDL is configured of "32" stages of the inverting circuit, the frequency variable range is 3.125 MHz to 312.5 MHz. Therefore, the frequency converting unit 101 according to this embodiment has a frequency variable range increased to 4 times that of the known frequency converting circuit (the frequency converting circuit in which the RDL is configured of "32" stages of the inverting circuit).

As described above, the frequency converting unit 101 according to this embodiment is provided with the switch elements. By causing the control unit 20 to control the switch elements to open and close, the number of the inverting circuits actually processing the pulse signal StartP among the inverting circuits included in the frequency converting circuit 101 can be changed. By this, the frequency variable range of the frequency converting unit 101 can be increased.

In addition, by causing the control unit 20 to control the switch elements included in the frequency converting unit 101 to open and close, the number of the inverting circuits constituting the VCO or the RDL is changed properly, and controls the frequency of the count pulse output therefrom. Therefore, the frequency converting unit 101 has the same function as that of a PGA (Programmable Gain Amplifier).

Specifically, when the signal output by the unit pixel 3 has a large delay quantity in the inverting circuit, the control unit 20 controls the switch elements included in the frequency converting unit 101 to open and close to reduce the number of the inverting circuits constituting the VCO or the RDL, so that the frequency of the count pulse output therefrom becomes higher. In addition, when the signal output by the unit pixel 3 has a small delay quantity in the inverting circuit, the control unit 20 controls the switch elements included in the frequency converting unit 101 to open and close to increase the number of the inverting circuits constituting the VCO or the RDL, so that the frequency of the count pulse output therefrom becomes lower.

Figure 12:
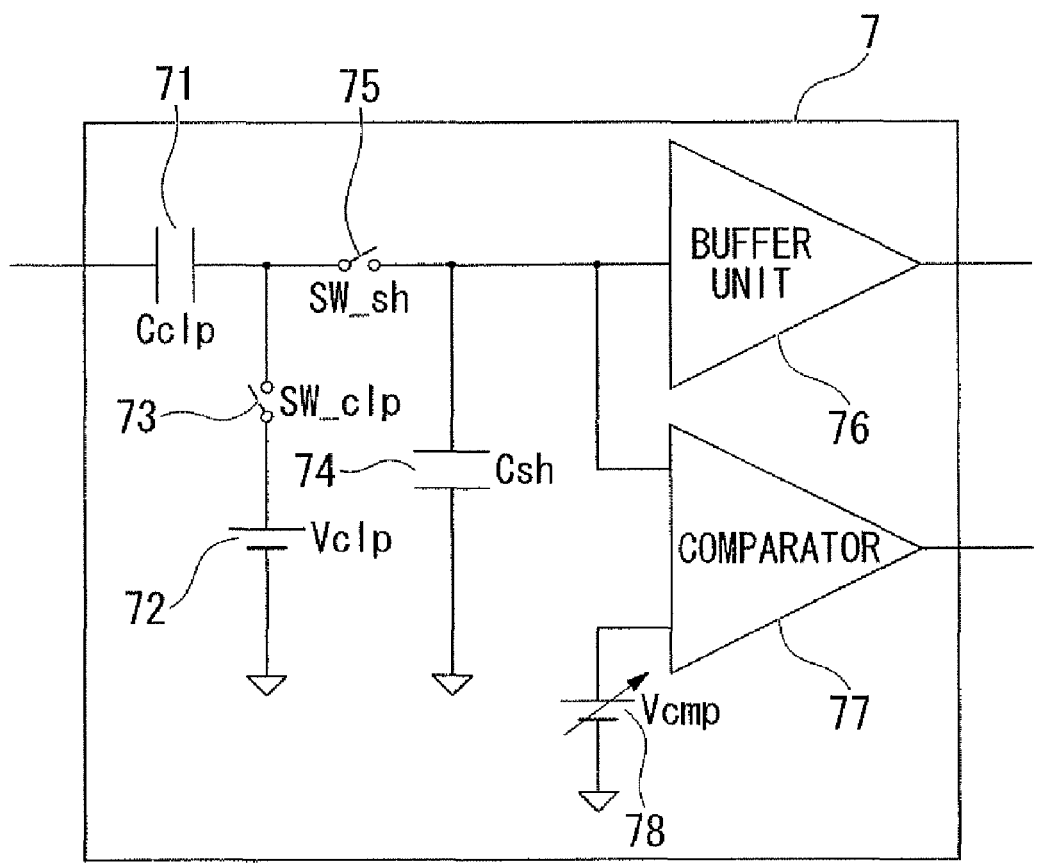
FIG. 12 is a view illustrating a circuit of an analog processing unit.

In addition, it is also possible to dynamically change the configuration of the VCO or the RDL according to the signal level output by the unit pixel 3. FIG. 12 is a view illustrating an example of a circuit of the analog processing unit 7 according to this embodiment. This circuit is configured by adding a comparator 77 and a variable comparison voltage 78 (Vcmp) to the circuit shown in FIG. 3. The comparator 77 compares the signal level after performing the CDS process with the variable comparison voltage Vcmp, so that the magnitude of the signal level can be detected. Based on this comparison result, the control unit 20 controls the switch elements included in the frequency converting unit 101 to open and close, so that the number of the inverting circuits constituting the RDL can be controlled (feedforward control) to be the optimal number.

As described above, according to this embodiment, by causing the control unit 20 to control the switch elements, the number of the inverting circuits constituting the VCO or the RDL can be easily changed, and the frequency converting unit 101 has the same function as that of the programmable gain amplifier. With such a configuration, the function of amplifying the signal from the pixel can be easily implemented by using a simple circuit configuration.

Further, by dynamically changing the configuration of the VCO or the RDL according to the magnitude of the signal output by the unit pixel, it is possible to obtain an image with high resolution and a high S/N (Signal to Noise ratio) ratio.

Hereinbefore, the embodiments of the invention have been described in detail with reference to the drawings. However, specific configurations are not limited to the embodiments, but various changes of design can be made herein without departing from the scope of the invention.

What is claimed is:

1. A solid-state image pickup apparatus comprising:
an image pickup unit which includes a plurality of pixels each of which includes a photoelectric conversion element generating and outputting a pixel signal according to a magnitude of an incident electromagnetic wave;
a frequency converting unit which includes a connection circuit for connecting a plurality of inverting circuits in a ring shape through which a delay time between an input signal and an output signal is changed according to a magnitude of the pixel signal, and one or a plurality of switch elements which are connected between an output terminal of the inverting circuit and an input terminal of another inverting circuit not adjacent to the inverting circuit, the frequency converting unit generating a clock signal having a frequency according to the connection circuit;
a control unit which controls the switch elements included in the frequency converting unit to open and close; and
a count unit which counts the clock signal generated by the frequency converting unit,
wherein the control unit controls the switch elements to open and close according to the magnitude of the pixel signal.

2. The solid-state image pickup apparatus according to claim 1, wherein the count unit is configured of an asynchronous counter.

3. The solid-state image pickup apparatus according to claim 1, wherein the count unit includes an up-count mode and a down-count mode.

4. The solid-state image pickup apparatus according to claim 1, wherein the frequency converting unit is configured of a voltage controlled oscillator.

5. The solid-state image pickup apparatus according to claim 1, wherein the frequency converting unit is configured of a ring delay line.

* * * * *